United States Patent
Fu et al.

(10) Patent No.: US 10,839,278 B1
(45) Date of Patent: Nov. 17, 2020

(54) ELECTROMAGNETIC EXPLORATION METHOD USING FULL-COVERAGE ANTI-INTERFERENCE ARTIFICIAL SOURCE

(71) Applicant: Institute of Geology and Geophysics, Chinese Academy of Sciences, Beijing (CN)

(72) Inventors: Changmin Fu, Beijing (CN); Qingyun Di, Beijing (CN); Miaoyue Wang, Beijing (CN); Da Lei, Beijing (CN); Ruo Wang, Beijing (CN); Zhiguo An, Beijing (CN); Xiaotian Wang, Beijing (CN); Jieyu Tan, Beijing (CN); Xiaolei Tu, Beijing (CN)

(73) Assignee: Institute of Geology and Geophysics, Chinese Academy of Sciences (CN)

( * ) Notice: Subject to any disclaimer, the term of this patent is extended or adjusted under 35 U.S.C. 154(b) by 0 days.

(21) Appl. No.: 16/871,282

(22) Filed: May 11, 2020

(30) Foreign Application Priority Data

Nov. 20, 2019 (CN) .......................... 2019 1 1142349

(51) Int. Cl.
*G06K 19/07* (2006.01)
*G01R 33/12* (2006.01)
*G01V 3/02* (2006.01)
*G06F 17/11* (2006.01)
*H04B 1/10* (2006.01)
*G01V 3/00* (2006.01)

(52) U.S. Cl.
CPC ......... *G06K 19/0726* (2013.01); *G01R 33/12* (2013.01); *G01V 3/00* (2013.01); *G06F 17/11* (2013.01); *G06K 19/0728* (2013.01); *H04B 1/1027* (2013.01)

(58) Field of Classification Search
CPC ..... G06K 19/0726; G06F 17/11; G01R 33/12; G01V 3/02
See application file for complete search history.

(56) References Cited

U.S. PATENT DOCUMENTS

| | | | | |
|---|---|---|---|---|
| 7,519,474 | B2 * | 4/2009 | Zhou ........................ | G01V 3/12 702/7 |
| 8,347,658 | B2 * | 1/2013 | Thompson .............. | G06F 19/00 70/11 |
| 2019/0383960 | A1 * | 12/2019 | Wang ........................ | G01V 3/40 |
| 2020/0003927 | A1 * | 1/2020 | Xue ......................... | G01V 3/10 |
| 2020/0003928 | A1 * | 1/2020 | Xue ......................... | G01V 3/34 |

* cited by examiner

Primary Examiner — Reena Aurora

(57) ABSTRACT

An electromagnetic exploration method using a full-coverage anti-interference artificial source, comprising the steps of: (1) determining the scope and location of the measuring area; (2) field-exploring to determine the location of the transmitting source and the angle of the transmitting antenna; (3) calculating the maximum polarization direction angle of the electric field generated by the antenna at each measuring point; (4) arranging electric field sensors according to the polarization directions; (5) calculating the apparent resistivity of each measuring point. The method of the present disclosure obtains the earth resistivity using the reliable data with high signal-to-noise ratio. The field construction is flexible and convenient, the construction efficiency is high and the cost is low. The present disclosure provides a new development direction for the electromagnetic exploration.

8 Claims, 4 Drawing Sheets

ELECTROMAGNETIC EXPLORATION METHOD USING FULL-COVERAGE ANTI-INTERFERENCE ARTIFICIAL SOURCE

TECHNICAL FIELD

This disclosure generally relates to the technical field of electromagnetic exploration, and more particularly, to an electromagnetic exploration method using a full-coverage anti-interference artificial source.

BACKGROUND

An electromagnetic exploration method is a method used for obtaining the electrical parameters, electric field distributions and electrical structures inside the earth through observing, analyzing and processing the earth's electromagnetic field. Various electromagnetic exploration methods may be formed according to different exploration targets, different observational devices, systems and data, as well as different processing and interpretation means.

The frequency domain artificial source electromagnetic method adopts a transmitting source with artificially-controlled signal strength and frequency, wherein the transmitting frequency ranges from $2^{-2}$ to $2^{13}$ Hz. The exploration depth is altered along with the frequency alteration. The lower the frequency is, the greater the exploration depth is. As the strength of an artificial source is much stronger than that of a natural field source, the number of times of signal collection and iteration may be significantly reduced, which greatly shortens the observation time and enhances the anti-interference ability. The aforesaid method provides an effective means for exploring the electrical structure within a depth range of 2 kilometers (km).

The Controlled Source Audio Magneto Telluric (CSAMT) method is a frequency domain artificial source electromagnetic method, which is developed based on the Magneto Telluric (MT) method. Professor D. W. Strangway and his graduate student M. A. Goldstein first proposed this method in 1971, and their research results were officially published in 1975. Afterwards, K. L. Zonge et al. formed a measurement method based on it and published their CSAMT theory and the details of the measurement method in 1991. Presently, through adopting the CSAMT method, a series of achievements have been made in the exploration of electrical structures of oil, gas and geothermal resources.

FIG. 1 shows a commonly-used field exploration plan using the CSAMT method. During the field exploration, an electric generator is adopted to supply power to a transmitter, the transmitter is used to control the frequency and waveform of electromagnetic signals, and the electromagnetic signals are transmitted to the underground via an AB transmitting antenna. While transmitting, a receiver is adopted to receive the signals in a particular area. Through processing the collected signals, the information of the underground electrical structure of the measuring area can be obtained.

When exploring in the field using the CSAMT method, the measuring area is always ensured to be within a trapezoid area with an opening angle less than 60° (shown in FIG. 1), and the electric field component Ex parallel to the transmitting antenna AB and the magnetic field component Hy perpendicular to the transmitting antenna AB are respectively collected.

In an actual field exploration, especially when exploring in an area with a complex underground geological structure, the location and direction of the measuring line need to be determined first, and then an electromagnetic signal transmitting source is arranged according to the determined measuring line. For the direction and position of the measuring line are determined, according to the coverage requirements of field strength, the transmitting antenna needs to be arranged in a direction parallel to the measuring line in a particular area. However, in many areas with complex terrain, it is impossible to transport electric generators and transmitters by truck, and the complex terrain conditions lead to the difficulty of arranging the transmitting antenna in a direction parallel to the measuring line. As a result, difficult construction and high construction cost are unavoidable.

A shortcoming of the conventional method is that low effective signal areas inevitably exist. FIG. 5 shows the coverage scope of effective signals of the CSAMT method, wherein the transmitting antenna is located in the center, and its surrounding represents the strength of the effective signals transmitted via the antenna. The brighter the Figure turns, the stronger the signals are, and the better the electromagnetic exploration may be facilitated. It can be seen that, at the edge of the trapezoid area, the field strength is obviously weakened, the anti-interference performance is low, and the data quality at the edge of the measuring area is poor. Due to the low coverage of effective signals, when the measuring line is long, the transmitter must be moved and re-arranged, resulting in low construction efficiency, high construction cost and poor data quality.

In the prior art, the signal receiver needs to simultaneously record the electric field signals and the magnetic field signals. Under such circumstances, electric field sensors and magnetic field sensors are required to be arranged in the field, making the field construction inconvenient.

SUMMARY

The purpose of the present disclosure is to describe an electromagnetic exploration method using a full-coverage anti-interference artificial source, which can solve the following technical problems:

(1) The arrangement of the transmitting source needs to be parallel to the measuring line at a particular location, which may lead to a failure of field construction in areas with a complex terrain.

(2) The field strength of effective signals in the measuring area is weak, the anti-interference performance is low, and the data quality is poor.

(3) When the measuring line is long, for there is a low electric field value band, the transmitting source needs to be re-arranged, resulting in low construction efficiency.

(4) The inconvenience of simultaneously arranging electric field sensors and magnetic field sensors makes the construction efficiency low and the construction cost high.

To achieve the above purpose, the present disclosure adopts the following technical solution:

An electromagnetic exploration method using a full-coverage anti-interference artificial source, comprising the steps of:

(1) Determining the scope and location of the measuring area: according to the size and scope of the underground exploration target, ensuring that the target is fully within the measuring area, namely, ensuring that the target's projection on the earth's surface is within the designed measuring area.

(2) Field-exploring to determine the location of the transmitting source and the angle of the transmitting antenna: after the scope of the measuring area is determined, carefully exploring the measuring area and surrounding areas; according to the actual terrain condition, selecting a transmitting source location convenient for the field exploration and transportation, thus allowing the transmitting source to be conveniently transported to the particular location by truck; according to the actual terrain condition, determining the location and direction of the transmitting antenna, thereby ensuring that the two ends A and B of the transmitting antenna are grounded well.

(3) Calculating the maximum polarization direction angle of the electric field generated by the antenna at each measuring point: collecting the field information of the measuring area, including the geological information and the existing geophysical data information; establishing a geodetic model according to the collected geological and geophysical data information of the measuring area; calculating and simulating the long axis polarization direction of the electric field generated by the transmitting antenna, comprising the following steps: At each measuring point, recording the position information R of the receiving measuring point; calculating the distance r relative to T, and the x-coordinate and y-coordinate of the measuring point; calculating the electric field values in x-direction and y-direction of the measuring point according to the following formula:

$$E_{x0} = \frac{I d_s \rho_0}{2\pi r^3} \left[ 1 + (irk + 1) e^{-ikr} - \frac{3y^2}{r^2} \right] \quad (1)$$

$$E_{y0} = \frac{I d_s \rho_0}{2\pi r^3} \frac{3xy}{r^2}$$

wherein $E_{x0}$ represents the x-direction component of the electric field, and $E_{y0}$ represents the y-direction component of the electric field, wherein I represents the transmitting current, $d_s$ represents the length of the transmitting antenna, and $\rho_0$ represents the resistivity of the geodetic model established based on the existing geological data, wherein r represents the distance from the position of the receiving measuring point to the center of the transmitting source, $r=\sqrt{x^2+y^2}$, and x and y are coordinates of the position of the receiving measuring point, wherein k represents the wavenumber, $$k = \sqrt{\mu \varepsilon \omega^2 - \frac{i\mu\omega}{\rho_0}},$$

$\omega=2\pi f$, and f represents the transmitting frequency, wherein the calculation formula of the maximum polarization direction angle of the electric field is:

$$\alpha = \frac{1}{2} \arctan\left( \frac{2|E_{x0}||E_{y0}|\cos(\varphi_y - \varphi_x)}{E_{x0}^2 - E_{y0}^2} \right) \quad (2)$$

wherein $\varphi_x$ represents the phase of the electric field component $E_{x0}$, and $$\varphi_x = \operatorname{atan}\left( \frac{\operatorname{imag}(E_x)}{\operatorname{real}(E_x)} \right),$$

wherein $\varphi_y$ represents the phase of the electric field component $E_{y0}$, and $$\varphi_y = \operatorname{atan}\left( \frac{\operatorname{imag}(E_y)}{\operatorname{real}(E_y)} \right),$$

wherein α cuts the included angle between the polarization direction of the long axis and the direction of x-coordinate, namely, the maximum polarization direction;

(4) Arranging electric field sensors according to the polarization directions: according to the electric field maximum polarization direction angles α obtained at each measuring point, arranging the electric field sensors at each measuring point to ensure that the included angle between the sensor direction and the x-axis is α; after the sensors of all measuring points are arranged, transmitting the signals, and recording the electric field values of each measuring point on the measuring line by a plurality of receivers.

(5) Calculating the apparent resistivity of each measuring point: using the iterative method to obtain the earth resistivity ρ when the difference between the calculated electric field and the measured electric field ($E_m$) is the smallest:

$$P=|E_m-E_x \cos \alpha -E_y \sin \alpha|=\text{Min.} \quad (3)$$

wherein $E_x$ and $E_y$ represent the electric field component x and electric field component y calculated by forward modelling:

$$E_x = \frac{I d_s \rho}{2\pi r^3} \left[ 1 + (irk + 1) e^{-ikr} - \frac{3y^2}{r^2} \right] \quad (4)$$

$$E_y = \frac{I d_s \rho}{2\pi r^3} \frac{3xy}{r^2}$$

wherein the actual formula is:

$$p = \left| E_m - \frac{I d_s \rho}{2\pi r^3} \left[ 1 + (irk + 1) e^{-ikr} - \frac{3y^2}{r^2} \right] \cos\alpha - \frac{I d_s \rho}{2\pi r^3} \frac{3xy}{r^2} \sin\alpha \right| = \text{Min.} \quad (5)$$

Compared with the prior art, the technical solution of the present disclosure achieves the following technical effects:

(1) The arrangement of the transmitting source is flexible; The transmitting source and the transmitting antenna are arranged according to an actual terrain condition in the field, and the position of the antenna is close to the measuring area, so that the coverage scope of effective signals can be ensured. As the location of the transmitting source and the direction of the transmitting antenna are unrestricted, and the direction of the transmitting antenna is arbitrary, the field construction becomes convenient and flexible, the construction efficiency is significantly improved, and the cost is greatly lowered.

(2) The present disclosure provides an electromagnetic exploration technology capable of achieving a full coverage of effective signals; Through adopting the technical solution of the present disclosure, a full coverage of effective signals around the transmitting source can be achieved. The measuring points can be arranged at any position around the transmitting source, and effective signal low value band does not exist. The positions of the receiving points are flexible, no longer restricted by the conventional method.

(3) The present disclosure makes full use of the signals generated by the transmitting antenna so that the influence of surrounding electromagnetic interference can be effectively resisted; The present disclosure obtains the calculation method of the maximum polarization direction of the electric field through studying the distribution characteristics of the electromagnetic field of the transmitting source adopted in the frequency domain artificial source electromagnetic method. According to the present disclosure, the direction of the electric field sensor is kept consistent with that of the electric field maximum polarization, thus ensuring that the field value with the maximum amplitude can be received at the measuring point. In this way, the effective signal strength at some locations are much stronger than that of the prior art, the interference of noise is effectively suppressed, and effective signals with high signal-to-noise ratio, as well as reliable observational data are obtained.

(4) The present disclosure merely utilizes the electric field data, achieving high work efficiency and low cost; The conventional method obtains the earth resistivity by simultaneously collecting the electric field data and the magnetic field data, and by simultaneously arranging electric field sensors and magnetic field sensors in the field, while the present disclosure obtains the earth resistivity by just collecting the electric field data and arranging electric field sensors in the field. Thus, convenient field construction, high efficiency and low construction cost are achieved.

In conclusion, the method of the present disclosure obtains the earth resistivity using the reliable data with high signal-to-noise ratio. The field construction is flexible and convenient, the construction efficiency is high and the cost is low. The method is reliable and effective, providing a new development direction for the electromagnetic exploration.

DETAILED DESCRIPTION

Figures and detailed embodiments are combined hereinafter to further elaborate the technical solution of the present disclosure.

An electromagnetic exploration method using a full-coverage anti-interference artificial source of the present disclosure, comprising the steps of:

(1) Determining the scope and location of the measuring area: according to the size and scope of the underground exploration target, ensuring that the target is fully within the measuring area, namely, ensuring that the projection of the target on the earth's surface is within the designed measuring area;

(2) Field-exploring to determine the location of the transmitting source and the angle of the transmitting antenna: after the scope of the measuring area is determined, carefully exploring the measuring area and surrounding areas; according to the actual terrain condition, selecting a transmitting source location convenient for the field exploration and transportation, thus allowing the transmitting source to be conveniently transported to the particular location by truck; according to the actual terrain condition, determining the location and direction of the transmitting antenna, thereby ensuring that the two ends A and B of the transmitting antenna are grounded well, wherein the length of the transmitting antenna AB is normally 1-3 km, which can be increased according to the actual situation to generate signals with large transmitting moment.

Figure 1:
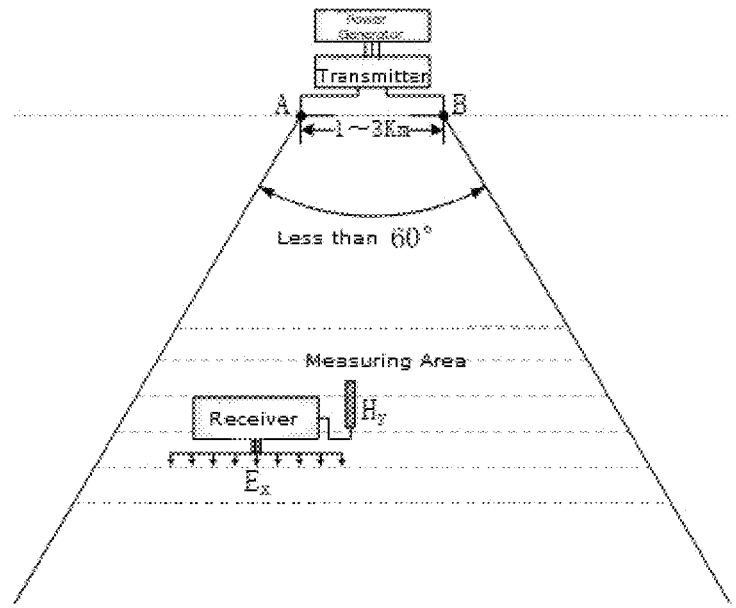
FIG. 1 is a conceptual diagram illustrating an example field construction of the conventional CSAMT method.
Figure 2:
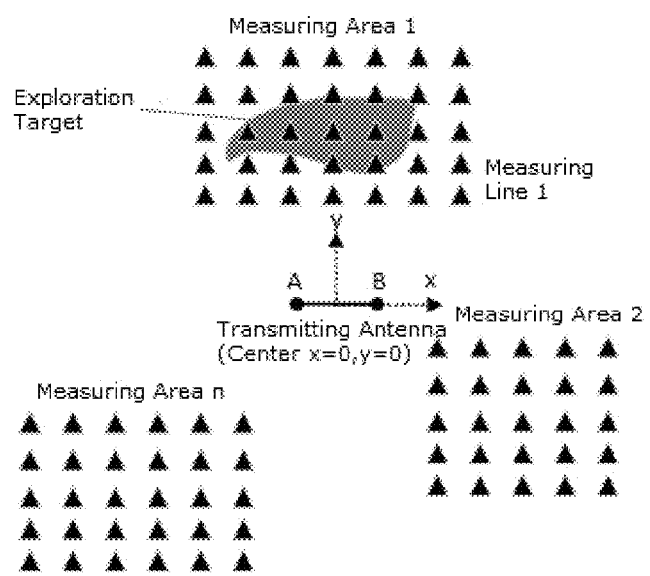
FIG. 2 is a conceptual diagram illustrating example locations of the transmitting source and the measuring points in the measuring areas of an embodiment of the present disclosure.

FIG. 2 shows the designed locations of the transmitting antenna and the measuring areas. A coordinate system taking the direction of the transmitting antenna as the x-direction, the direction perpendicular to the transmitting antenna as the y-direction, and the center coordinates of the transmitting source as the origin point is established. The actual position of the center of the transmitting source is recorded as T. Taking the true north direction as 0° and the clockwise direction as the positive direction, the actual direction of the transmitting antenna is recorded as $T_{Direction}$.

In this embodiment, the length of the transmitting antenna is 1 km, the transmitting frequency is 512 Hz, the transmitting current is 10 A, the perpendicular distance between the measuring line 1 and the transmitting antenna is 5 km, and the actual earth resistivity is 1000 ohm·m.

(3) Calculating the maximum polarization direction angle of the electric field generated by the antenna at each measuring point: collecting the field information of the measuring area, including outcrop, borehole and other geological information, as well as the existing geophysical data information; establishing a geodetic model according to the collected geological and geophysical data of the measuring area, wherein in this embodiment, the earth is assumed to be homogeneous, and its resistivity is 500 ohm·m; calculating and simulating the long axis polarization direction of the electric field generated by the transmitting antenna, comprising the following steps: At each measuring point, recording the position information R of the receiving measuring point; calculating the distance r relative to T, and the x-coordinate and y-coordinate of the measuring point; calculating the electric field values in x-direction and y-direction of the measuring point according to the following formula:

$$E_{x0} = \frac{Id_s\rho_0}{2\pi r^3}\left[1 + (irk + 1)e^{-ikr} - \frac{3y^2}{r^2}\right] \quad (3)$$

$$E_{y0} = \frac{Id_s\rho_0}{2\pi r^3}\frac{3xy}{r^2}$$

wherein $Ex_0$ represents the x-direction component of the electric field, and $Ey_0$ represents the y-direction component of the electric field, wherein I represents the transmitting current, $d_s$ represents the length of the transmitting antenna, and $\rho_0$ represents the resistivity of the geodetic model established based on the existing geological data, wherein in this embodiment, the resistivity of the geodetic model is 500 ohm·m, wherein r represents the distance from the position of the receiving measuring point to the center of the transmitting source, $r=\sqrt{x^2+y^2}$, and x and y are coordinates of the position of the receiving measuring point, wherein k represents the wavenumber, $$k = \sqrt{\mu\varepsilon\omega^2 - \frac{i\mu\omega}{\rho_0}},$$

Figure 3:
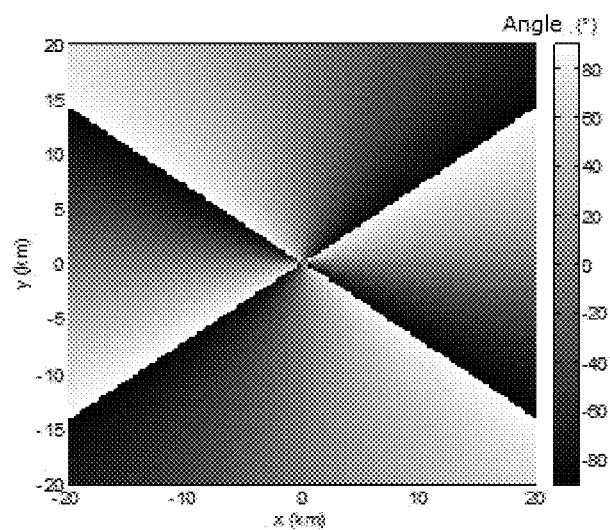
FIG. 3 is a conceptual diagram illustrating the maximum polarization angle of the electric field around the transmitting source of an embodiment of the present disclosure.

$\omega=2\pi f$, and f represents the transmitting frequency, wherein the calculation formula of the maximum polarization direction angle of the electric field is:

$$\alpha = \frac{1}{2}\arctan\left(\frac{2|E_{x0}||E_{y0}|\cos(\varphi_y - \varphi_x)}{E_{x0}^2 - E_{y0}^2}\right) \quad (4)$$

wherein $\varphi_x$ represents the phase of the electric field component $E_{x0}$, and $$\varphi_x = \operatorname{atan}\left(\frac{\operatorname{imag}(E_x)}{\operatorname{real}(E_x)}\right),$$

wherein $\varphi_y$ represents the phase of the electric field component $E_{y0}$, and $$\varphi_y = \operatorname{atan}\left(\frac{\operatorname{imag}(E_y)}{\operatorname{real}(E_y)}\right),$$

wherein α represents the included angle between the polarization direction of the long axis and the direction of x-coordinate, namely, the maximum polarization direction; calculating the electric field maximum polarization angles of all measuring points around the transmitting antenna as shown in FIG. 3 (the clockwise direction is taken as the negative direction).

Figure 4:
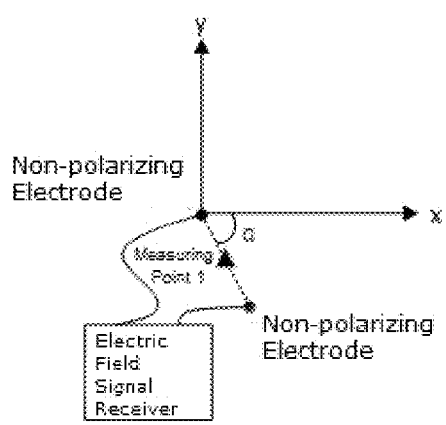
FIG. 4 is a conceptual diagram illustrating an example field arrangement of the electric field sensor (non-polarizing electrode) at measuring point 1 of an embodiment of the present disclosure.

(4) Arranging electric field sensors according to the polarization directions: according to the electric field maximum polarization direction angles α obtained at each measuring point, arranging the electric field sensors at each measuring point to ensure that the included angle between the sensor direction and the x-axis is α. Taking the receiving measuring point whose coordinates are x=5 km and y=5 km as an example, the obtained electric field maximum polarization angle α at the receiving measuring point is about −71°, and the included angle between the direction of the electric field sensor at the actual measuring point in the field and the x-axis should be −71°. The arrangement of the sensors in the field is shown in FIG. 4; after the sensors of all measuring points are arranged, transmitting the signals, and recording the electric field values of each measuring point on the measuring line by a plurality of receivers;

(5) Calculating the apparent resistivity of each measuring point: at this point, the measured electric field value of each measuring point is obtained, wherein the amplitude of the measured electric field value is large, and the data quality is much better than that obtained using the existing technology; using the iterative method to obtain the earth resistivity ρ when the difference between the calculated electric field and the measured electric field ($E_m$) is the smallest:

$$p=|E_m-E_x \cos\alpha-E_y \sin\alpha|=\operatorname{Min}. \quad (5)$$

wherein $E_x$ and $E_y$ represent the electric field component x and electric field component y calculated by forward modelling:

$$E_x = \frac{Id_s\rho}{2\pi r^3}\left[1 + (irk + 1)e^{-ikr} - \frac{3y^2}{r^2}\right] \quad (4)$$

$$E_y = \frac{Id_s\rho}{2\pi r^3}\frac{3xy}{r^2}$$

wherein the actual formula is:

$$p = \left|E_m - \frac{Id_s\rho}{2\pi r^3}\left[1 + (irk + 1)e^{-ikr} - \frac{3y^2}{r^2}\right]\cos\alpha - \frac{Id_s\rho}{2\pi r^3}\frac{3xy}{r^2}\sin\alpha\right| = \operatorname{Min}. \quad (5)$$

The aforesaid formula can be calculated as all values are known except for the variable earth resistivity. After calculation, the earth resistivity is 1000 ohm·m.

It can be seen that, through adopting the technical solution of the present disclosure, reliable and effective signals with high signal-to-noise ratio are obtained, environmental noise interference is effectively suppressed, and data quality is stable and reliable. Although there is a big difference between the actual earth resistivity and the initial geodetic model with resistivity set to be 500 ohm·m in this embodiment, the actual earth resistivity can still be obtained. Its objective is to verify whether there is a big difference between the resistivity of the initial model and the actual earth resistivity.

Figure 5:
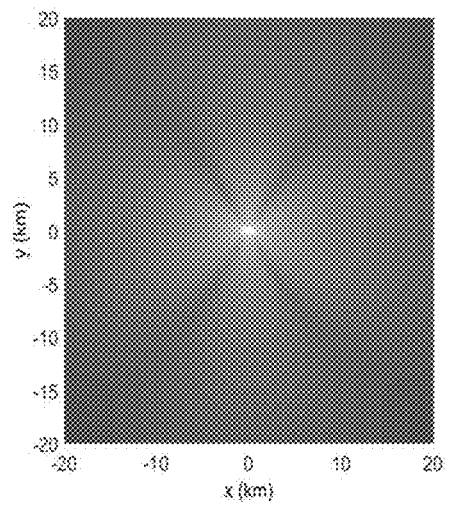
FIG. 5 is a conceptual diagram illustrating the coverage scope of effective signals of the conventional CSAMT method.

FIG. 5 shows the coverage scope of field strength of the conventional method, wherein the brightness of the figure represents the strength of effective signals. It can be seen that the effective signal strength of the conventional method is weak and the quality of the observational data is poor. Even worse, there are low effective signal areas, which may lead to the failure of field construction.

Figure 6:
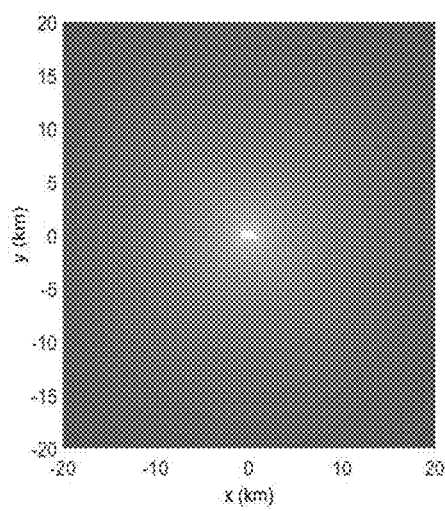
FIG. 6 is a conceptual diagram illustrating the coverage scope of effective signals of an embodiment of the present disclosure.

FIG. 6 shows the coverage scope of effective signals of the present disclosure. It can be found that the present disclosure achieves a high-intensity full-coverage of effective signals around the transmitting source. According to the present disclosure, the field construction efficiency is greatly improved, the construction cost is lowered, and through the effective suppression of noise, the field data with high reliability is obtained.

Figure 7:
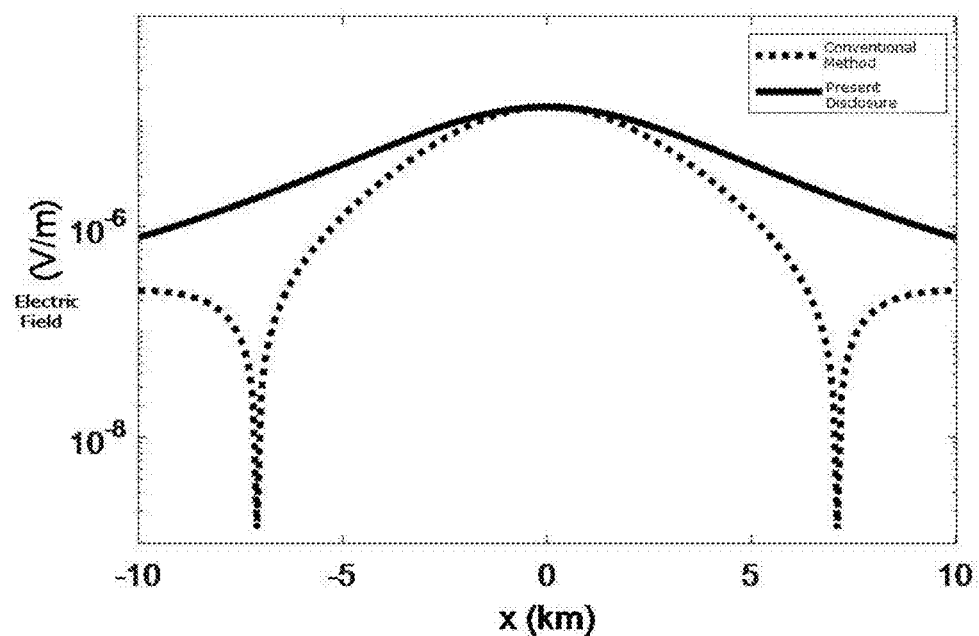
FIG. 7 a conceptual diagram illustrating a comparison between the electric field effective signals of the present disclosure and that of the prior art.

FIG. 7 shows a comparison between the calculated effective electric field value observed on the measuring line 1 of the present disclosure and the effective electric field value of the conventional method. It can be noticed that the electric field value of the conventional method is significantly lower than that of the present disclosure, which results in a poor data quality. Moreover, there is an obvious low electric field value band, which makes effective signals submerged in the noise, or even leads to the failure of construction. The effective electric field value of the present disclosure is obviously larger than that of the conventional method. The present disclosure effectively suppresses the noise, greatly improves the data quality, and ensures that the effective data with high signal-to-noise ratio can be collected in the field.

What is claimed is:

1. An electromagnetic exploration method using a full-coverage anti-interference artificial source, comprising:
   determining a scope and a location of a measuring area;

field-exploring to determine a location of a transmitting source and an angle of a transmitting antenna;

calculating a maximum polarization direction angle of an electric field generated by the antenna at each measuring point;

arranging electric field sensors according to polarization directions, and keeping the direction of the electric field sensor consistent with the maximum polarization direction of the electric field; and calculating an apparent resistivity of each measuring point.

2. The electromagnetic exploration method using a full-coverage anti-interference artificial source of claim 1, wherein determining the scope and location of the measuring area comprises ensuring that the target is fully within the measuring area according to a size and a scope of an underground exploration target, wherein ensuring the target is fully within the measuring area comprises ensuring a projection of the target on a surface of earth is within a designed measuring area.

3. The electromagnetic exploration method using a full-coverage anti-interference artificial source of claim 1, wherein field-exploring to determine the location of the transmitting source and the angle of the transmitting antenna comprises:

exploring the measuring area in response to determining the scope of the measuring area, selecting a transmitting source location convenient for the field exploration and transportation according to actual terrain condition of the measuring area, determining a location and a direction of the transmitting antenna according to actual terrain condition of the measuring area, and ensuring two ends of the transmitting antenna are grounded.

4. The electromagnetic exploration method using a full-coverage anti-interference artificial source of claim 1, wherein calculating the maximum polarization direction angle of the electric field generated by the antenna at each measuring point comprises:

collecting field information of the measuring area, including geological information and existing geophysical data information, establishing a geodetic model according to the geological and the existing geophysical data information of the measuring area, and calculating and simulating a long axis polarization direction of the electric field generated by the transmitting antenna.

5. The electromagnetic exploration method using a full-coverage anti-interference artificial source of claim 4, wherein calculating and simulating the long axis polarization direction of the electric field generated by the transmitting antenna comprises:

recording a position information R of each measuring point, calculating a distance r relative to an actual position information T of a center of the transmitting source, and an x-coordinate and a y-coordinate of each measuring point, and calculating electric field of each measuring point according to the following formula:

$$E_{x0} = \frac{Id_s \rho_0}{2\pi r^3}\left[1 + (irk + 1)e^{-ikr} - \frac{3y^2}{r^2}\right] \quad (1)$$

-continued $$E_{y0} = \frac{Id_s \rho_0}{2\pi r^3} \frac{3xy}{r^2}$$

wherein $E_{x0}$ represents a x-direction component of the electric field, wherein $E_{y0}$ represents a y-direction component of respective electric field, wherein I represents a transmitting current, $d_s$ represents a length of the transmitting antenna, and $\rho_0$ represents a resistivity of the geodetic model established based on the existing geological data, wherein r represents a distance from respective measuring point to the center of the transmitting source, $r=\sqrt{x^2+y^2}$, wherein x represents the x-coordinate and y represents the y-coordinate of the respective measuring point, wherein k represents a wavenumber, $$k = \sqrt{\mu\varepsilon\omega^2 - \frac{i\mu\omega}{\rho_0}},$$

$\omega=2\pi f$, wherein f represents a transmitting frequency.

6. The electromagnetic exploration method using a full-coverage anti-interference artificial source of claim 5, wherein calculating the maximum polarization direction angle of the electric field generated by the antenna at each measuring point comprises calculating the maximum polarization direction angle of the electric field according to the following formula:

$$\alpha = \frac{1}{2}\arctan\left(\frac{2|E_{x0}||E_{y0}|\cos(\varphi_y - \varphi_x)}{E_{x0}^2 - E_{y0}^2}\right) \quad (4)$$

wherein $\varphi_x$ represents phase of electric field component $E_{x0}$, and $$\varphi_x = \text{atan}\left(\frac{\text{imag}(E_x)}{\text{real}(E_x)}\right),$$

wherein $\varphi_y$ represents phase of electric field component $E_{y0}$, and $$\varphi_y = \text{atan}\left(\frac{\text{imag}(E_y)}{\text{real}(E_y)}\right),$$

wherein $\alpha$ represents the maximum polarization direction of the electric field, which is an included angle between the long axis polarization direction of the electric field and x-coordinate of respective measuring point.

7. The electromagnetic exploration method using a full-coverage anti-interference artificial source of claim 6, wherein arranging electric field sensors according to the polarization directions comprises:

according to the electric field maximum polarization direction angles $\alpha$ obtained at each measuring point, arranging the electric field sensors at each measuring point to ensure that the included angle between the sensor direction and the x-axis is $\alpha$, and in response to arranging the electric field sensors, transmitting signals, and recording the electric field of each measuring point on measuring line by a plurality of receivers.

8. The electromagnetic exploration method using a full-coverage anti-interference artificial source of claim 7, wherein calculating the apparent resistivity of each measuring point comprises:

using iterative method to obtain earth resistivity $\rho$ when the difference between calculated electric field and measured electric field is the smallest, wherein $\rho$ is calculated according to the following formula:

$$P = |E_m - E_x \cos\alpha - E_y \sin\alpha| = \text{Min.} \quad (3)$$

wherein $E_x$ represents the electric field component x and $E_y$ represent the electric field component, wherein $E_x$ and $E_y$ are calculated according to the following formula:

$$E_x = \frac{Id_s\rho}{2\pi r^3}\left[1 + (irk + 1)e^{-ikr} - \frac{3y^2}{r^2}\right] \quad (4)$$

$$E_y = \frac{Id_s\rho}{2\pi r^3}\frac{3xy}{r^2}$$

wherein an actual formula is:

$$p = \left|E_m - \frac{Id_s\rho}{2\pi r^3}\left[1 + (irk + 1)e^{-ikr} - \frac{3y^2}{r^2}\right]\cos\alpha - \frac{Id_s\rho}{2\pi r^3}\frac{3xy}{r^2}\sin\alpha\right| = \text{Min.} \quad (5)$$

\* \* \* \* \*